United States Patent [19]

Gallagher et al.

[11] Patent Number: 5,055,158

[45] Date of Patent: Oct. 8, 1991

[54] PLANARIZATION OF JOSEPHSON INTEGRATED CIRCUIT

[75] Inventors: William J. Gallagher, Ardsley; Chao-Kun Hu, Somers; Mark A. Jaso, Yorktown Heights, all of N.Y.; Mark B. Ketchen, Hadley, Mass.; Alan W. Kleinsasser, Putnam Valley; Dale J. Pearson, Yorktown Heights, both of N.Y.

[73] Assignee: International Business Machines Corporation, Armonk, N.Y.

[21] Appl. No.: 680,441

[22] Filed: Apr. 4, 1991

Related U.S. Application Data

[62] Division of Ser. No. 587,388, Sep. 25, 1990.

[51] Int. Cl.$^5$ .................. H01L 21/306; B44C 1/22; C23F 1/02; C03C 15/00
[52] U.S. Cl. .................. 156/643; 156/645; 156/651; 156/653; 156/656; 156/657; 156/659.1; 156/667; 505/728; 505/820
[58] Field of Search ............... 156/643, 636, 645, 646, 156/651, 653, 656, 657, 659.1, 662, 667; 204/192.24; 427/62, 63; 505/1, 728, 731, 816, 820

[56] References Cited

U.S. PATENT DOCUMENTS 4,548,834 10/1985 Tsuge et al. .................. 427/63
4,904,619 2/1990 Yamada et al. .................. 437/190

OTHER PUBLICATIONS

S. Nagasawa et al., "Planarization Technology for Josephson Integrated Circuits", IEEE Electron Devices Letter, vol. 9, No. 8, pp. 414–416, Aug. 1988.

M. Gurvitch et al., "High Quality Refractory Josephson Tunnel Junctions Utilizing Thin Aluminum Layers", Appl. Phys. Lett. 42(5), pp. 472–474, Mar. 1, 1983.

H. Kroger et al., "Selective Niobium Anodization Process for Fabricating Josephson Tunnel Junctions", Appl. Phys. Lett. 39(3), pp. 280–282, Aug., 1981.

M. Gurvitch et al., "Preparation and Properties of Nb Josephson Junctions with Thin Al Layers", IEEE Transaction on Magnetics, vol. Mag-19, No. 3, pp. 791–794, May 1983.

B. Davari, "A New Planarization Technique Using a Combination of RIE and Chemical Mechanical Polish (CMP)", IEEE, IEDM, pp. 61–64, 1989.

Primary Examiner—William A. Powell
Attorney, Agent, or Firm—Robert M. Trepp

[57] ABSTRACT

A method for fabricating Josephson integrated circuits and the circuit is described incorporating the steps of depositing layers of different materials to form a trilayer Josephson junction, etching to define a plurality of trilayer areas, depositing dielectric material thereover, and chemical-mechanical polishing to planarize the dielectric material down to provide a coplanar surface with the tops of the trilayer areas for subsequent interconnection. The invention overcomes the problem of poor quality Josephson junctions, low Vm's, and crevices or gaps in the upper coplanar surface between the trilayer area and the surrounding dielectric material.

14 Claims, 8 Drawing Sheets

PLANARIZATION OF JOSEPHSON INTEGRATED CIRCUIT

This is a division of application Ser. No. 07/587,388, filed Sept. 25, 1990.

BACKGROUND OF THE INVENTION

1. Field of the Invention

This invention relates to Josephson integrated circuits including superconducting quantum interference devices (squid) and more particularly to fabricating Josephson integrated circuits using chemical-mechanical polishing.

2. Description of the Prior Art

In a publication by Nagasawa et al. entitled "Planarization Technology for Josephson Integrated Circuits," IEEE Electron Devices Letter, Vol. 9, No. 8, August 1988, the fabrication of Josephson integrated circuits is described using a planarization technique to provide level surfaces for forming insulating and metallization layers. For optimum contact, Nagasawa et al. shows a flow chart for the junction planarization process. After the junction area, consisting of an $Nb/AlO_x/Nb$ trilayers, is defined by reactive ion etching (RIE) on the Nb lower wire layer, the $SiO_2$ insulating layer, whose thickness is greater than that of the trilayers, is deposited by RF magnetron sputtering. A two thousand-molecular weight polystyrene solution is spun on the $SiO_2$ insulating layer. The polystyrene film surface is planarized by baking at 180° C. for thirty-min in nitrogen. Both the polystyrene film and $SiO_2$ are etched by RIE at the same etching rate (etch back) until the top surface of the junction appears. An upper wire layer of Nb is then formed on the planarized surface.

In a publication by Gurvitch et al, Appl. Phys. Lett. 42(5), Mar. 1, 1983, entitled "High quality refractory Josephson tunnel junctions utilizing thin aluminum layers", Josephson tunnel junctions were described as being prepared using selective niobium anodization process or by selective niobium etching process. The etching may be by plasma or reactive ion etching of the niobium layer. The resulting Josephson junctions are not planarized.

In a publication by Kroger et al., entitled "Selective niobium anodization process for fabricating Josephson tunnel junctions,", Appl. Phys. Lett. 39(3), 280 (August 1981), a process for fabricating refractory super conducting tunnel junctions is described. A trilayer sandwich is initially deposited which forms a tunnel junction covering the entire substrate. Those areas which eventually will become the Josephson devices are covered with photoresist. The photoresist blocks the anodization of the upper electrode of the josephson devices. The anodization proceeds until the entire thickness of the unmasked upper superconductor is converted to an oxide which isolates the upper electrodes of many Josephson devices formed on the same substrate.

In a publication by Gurvitch et al, IEEE Transaction on Magnetics, Vol Mag-19, No.3, May 1983, entitled "Preparation and properties of Nb Josephson junctions with thin al layers", Josephson tunnel junctions of the types Nb/Al-oxide-Nb and Nb/Al-oxide-Al/Nb, were described. The tunnel barrier was formed by in-situ thermal oxidation. Individual junctions were defined using photo lithography coupled with a plasma etching technique. The use of plasma etching or reactive ion etching ( a dry chemically active process) allows the utilization of the aluminum oxide as a very convenient barrier stop. The whole process was called selective niobium etching process (SNEP). An insulating layer is provided over the etched surfaces by using liquid anodization of the exposed layer to 20–40 V, thus creating about 400–900 angstroms of anodic oxide of Nb. The photoresist pad protecting the top surface of the counter electrode is then removed and the counter electrode is cleaned by ion milling or rf sputter etching.

In the semiconductor industry, chemical mechanical polish (CMP) has been used for preparing the surfaces of wafers mainly of silicon and includes utilizing a slurry which includes an abrasive material as well as selected chemicals to provide mechanical as well as chemical action at the surface of the wafer as the wafer in a chuck or quill over a pad on a table. One publication which describes chemical-mechanical polishing is by Bonora entitled "Silicon Wafer Process "Technology: Slicing, Etching, Polishing," found in Semiconductor Silicon 1977, Electrochem. Soc., Pennington, N.J., pp. 154.

In the In the prior art, polishing has been used extensively for prepariprepaaring optical lenses utilizing a slurry of aluminum oxide in water.

SUMMARY OF THE INVENTION

In accordance with the present invention, an apparatus and method is described for making a Josephson integrated circuit comprising the steps of depositing a first layer of the superconducting material for example niobium on the upper surface of a substrate, depositing a second layer of insulating material for example aluminum which is subsequently oxidized to form aluminum oxide on the first layer, depositing a third layer of semiconducting material of for example niobium on the second layer to form a trilayer Josephson junction, etching through the third and second layers into the first layer in selected areas to form space depart trilayer areas each having a selected cross-section area parallel to the upper surface and thinned areas of the first layer between the spaced apart trilayer areas, etching selectively the thinned areas of the first layer to form a conductor for interconnecting selected first layers of the trilayer areas and for forming inducting elements for example a spiral inductor, depositing a fourth layer of insulating material, which may be for example sputtered quartz over the trilayer areas, the conductor and the substrate, polishing the upper surface of the fourth layer of the insulating material to provide a substantially planar surface, and polishing the third and fourth layers to expose all of the third layers of the trilayer areas to provide a substantially coplanar surface of the third layer of the trilayer areas and the fourth layer whereby the effect of variations or non-uniformities in thickness of the trilayer areas, the conductor, the substrate and the fourth layer are removed. These steps of polishing may be accomplished by chemical mechanical polishing using a surry of water and an abrasive such as silicon as well as additional chemicals to provide Ph-adjustment.

The invention further provides a Josephson integrated circuit having a base electrode interconnected to other base electrodes, an inductive element coupled to selective base electrodes, a dielectric layer extending from and around the Josephson junction and counterelectrode of the Josephson junction to provide an upper surface which is coplanar with the counterelectrode, and self-aligned metallization on the coplanar surface of the dielectric material to provide contact to selected conterelectrodes. The Josephson intergrated circuit may also include additional interconnection layer formed above the dielectric layer and also may include resistive elements formed on the dielectric layer or on additional insulating layers provided above the dielectric layer.

DESCRIPTION OF THE PREFERRED EMBODIMENT

Figure 1:
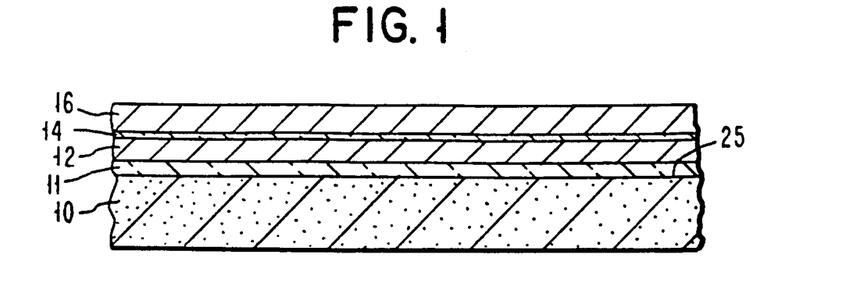
FIGS. 1-4 show process steps for forming spaced apart Josephson juntions.

Referring to the drawing and in particular to FIG. 1, a substrate 10 which may be for example silicon having a diameter of for example, 12.7 to 20.32 cms (5 to 8 inches). An insulating layer 11 is provided over substrate 10 which may be for example silicon oxide formed thermally. Substrate 10 as well as insulating layer 11 may be polished to provide a planar surface. A first layer 12 of semiconductor material is deposited over insulating layer 11. First layer 12 may be for example niobium and may be deposited by sputtering. First layer 12 may be for example 2000 angstroms thick. Insulating layer 11 may be for example 6000 angstroms thick. A second layer of insulating material 14 is formed over first layer 12. Insulating layer 14 may be for example aluminum oxide ($Al_2O_3$) which may be grown thermally at low pressure and ambient temperature on a thin aluminum layer sputter deposited on the top of the base electrode, first layer 12 which may be niobium. Insulating layer 14 may be for example 20 angstroms thick. A third layer 16 of superconducting material which may be for example niobium is deposited over insulating layer 14. Third layer 16 may be for example niobium which may be sputtered onto insulating layer 14 and have a thickness of 1500 angstroms. First layer 12, second layer 14 and third layer 16 form a trilayer Josephson junction which has a very large area and which may for example cover the entire substrate 10. First layer 12 forms a base electrode, second layer 14 forms a barrier layer of the junction, and third layer 16 forms the counterelectrode.

Figure 2:
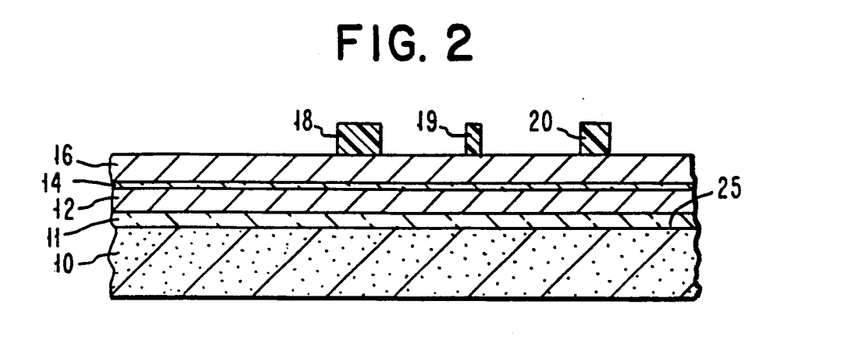

Referring to FIG. 2, photoresist material is deposited and patterned to form masks 18, 19 and 20 on third layer 16. In FIG. 2, like references are used for functions corresponding to the apparatus in FIG. 1.

Figure 3:
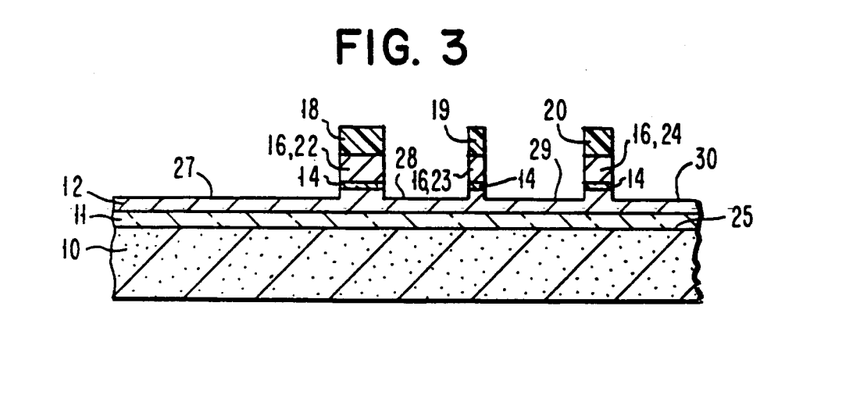

Referring to FIG. 3, third layer 16 and second layer 14 are etched in selected areas and into first layer 12 to form spaced apart trilayer areas 22-24 each having a selected cross-section area parallel to the upper surface 25 trilayer areas 22-24 may be for example round in cross-section, rectangular, square, or have any other geometry and area. Layer 16 has thinned areas 27-30 between and around trilayer areas 22-24.

Trilayer areas 22-24 may be formed by reactive ion etching (RIE). Optical emission endpoint may be used to determine the first endpoint, some percentage etch beyond reaching second layer 14 which may be for example 500 angstroms. Thus, first layer 12 may have thinned areas 27-30 of about 1500 angstroms thick.

In FIG. 3, like references are used for functions corresponding to the apparatus in FIG. 2.

Figure 4:
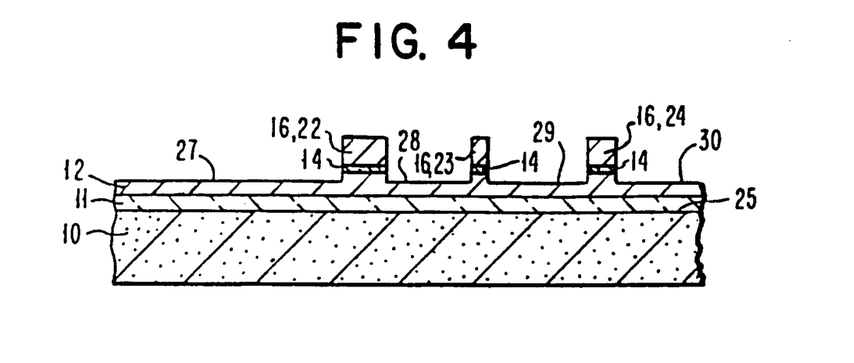

Referring to FIG. 4, masks 18-20 are removed or stripped. In FIG. 4, like references are used for functions corresponding to the apparatus in FIG. 3.

Figure 5:
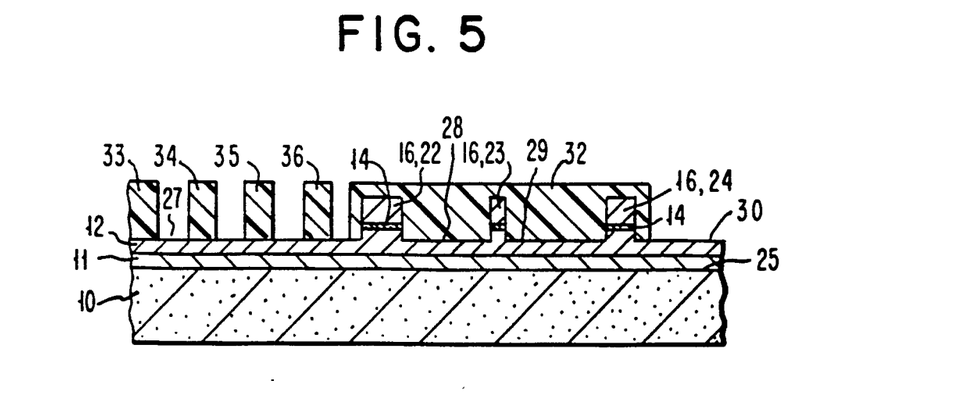
FIGS. 5-7 show process steps for forming interconnections and inductors.

Referring to FIG. 5, resist 32 is deposited and patterned to cover trilayer areas 22-24. Also, resists 33-36 are deposited and patterned over first layer 12.

Figure 6:
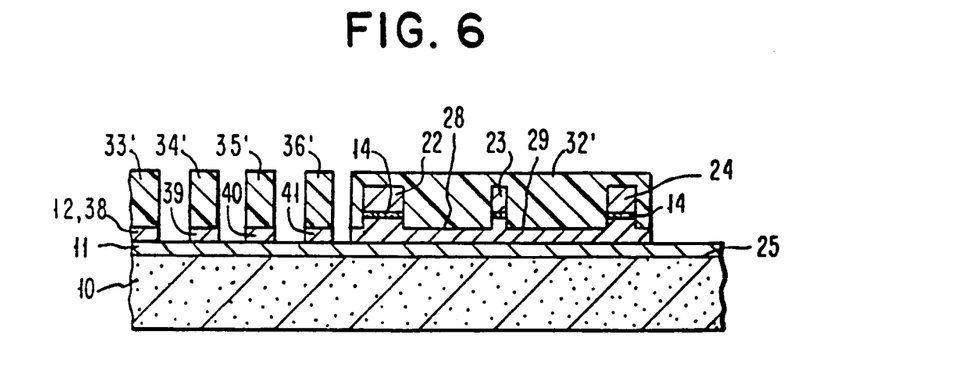

The embodiment shown in FIG. 5 may be etched either by using reactive ion etching or by using a chlorine based etchant which results in fairly high selectivity to the underlying layer 11 of insulating material. If reactive ion etching is used, optical emission endpoint is used to determine the end of the etch process, some percentage beyond layer 12 removal. As shown in FIG. 6, thinned areas 27 and 30 were selectively etched. Thinned areas 28 and 29 remain for interconnecting layer 12 base electrode of trilayer areas 22-24. Thinned area 27 was patterned to form connectors 38-41 which may be for example the cross-section of a spiral inductor. It is noted in FIG. 6 that resists 32'-36' are shown which are slightly thinner than resists 32'-36' shown in FIG. 5 due to the effect or reactive ion etching.

Figure 7:
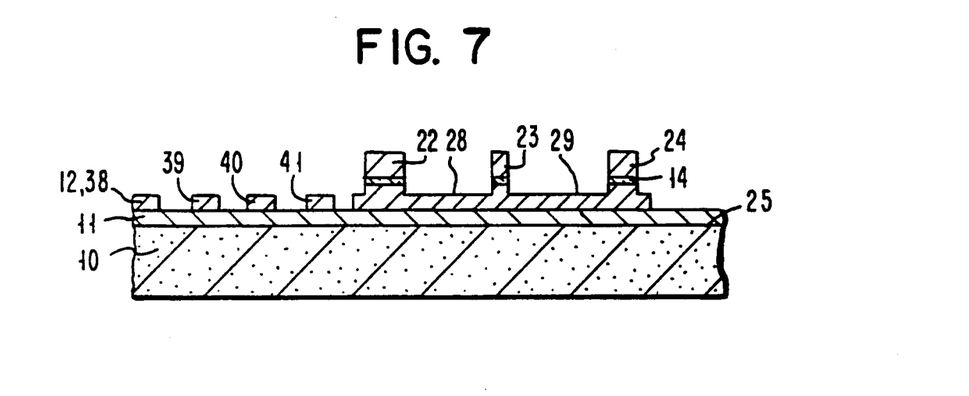

Referring to FIG. 7, resists 32'-36' have been stripped or removed. In FIGS. 5 through 7, like references are used for functions corresponding to the apparatus of FIG. 4.

Stripping of the resists 32'-36' following the step of reactive ion etching may be accomplished by ultrasonic agitation of the resist in a solution such as NMP at 75 degrees centigrade. Reactive ion etching to form trilayer areas 22-24 may be made by the use of $CF_4$ which is well known in the art or may be made by variations of reactive ion etching which is well known in the art. Note that the junction area 14 of trilayer areas 22-24 are completely determined by the steps of lithography, depositing patterning a resist and reactive ion etching as shown in FIGS. 1-4. In the case where the lateral feature size of the base electrode, layer 12 is greater than the junction width, second layer 14, by worst case overlay, the junction area is completely determined by the first masking step and reactive ion etching step as shown in FIGS. 1-4. The step of anodization may follow the first reactive ion etching step as shown in FIG. 3 to form about 100 angstroms of niobium oxide ($Nb_2O_5$) which provides a dual dielectric structure of niobium oxide and the subsequently deposited dielectric shown in FIG. 8.

Figure 8:
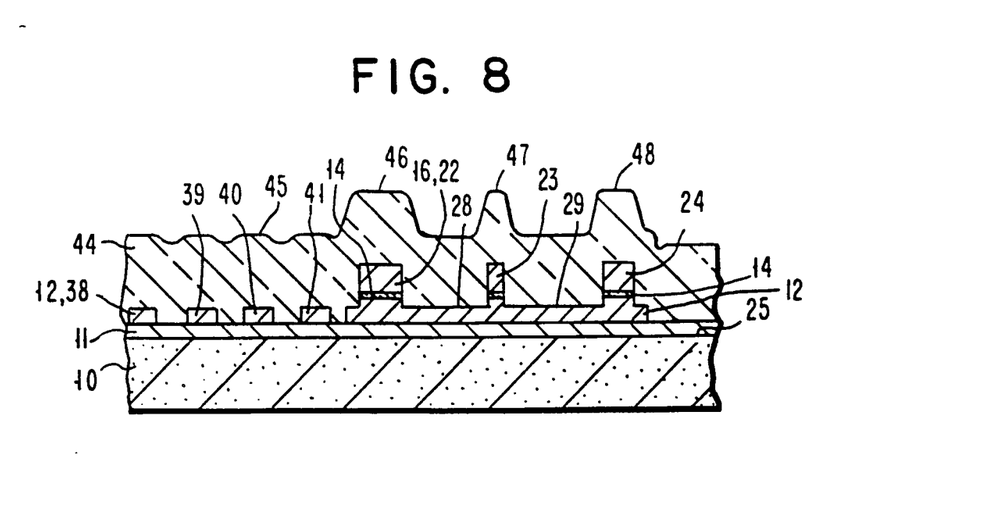
FIGS. 8-10 show process steps for planarizing the top surface

Referring to FIG. 8, a fourth layer 44 of dielectric material for example silicon oxide is deposited over substrate layer 11, conductors 38-41, trilayer areas 22-24. Fourth layer 44 may be deposited by sputtering.

When fourth layer 44 is deposited over an uneven surface, the unevenness is imparted to the upper surface 45 of fourth layer 44 even when a smoothing process such as sputtering is used. If fourth layer 44 was deposited by vacuum deposition, the unevenness of the upper surface 45 would be more pronounced and would follow more closely the shape of the underlying surface. Peaks 46-48 in upper surface 45 correspond to trilayer areas 22-24.

Figure 9:
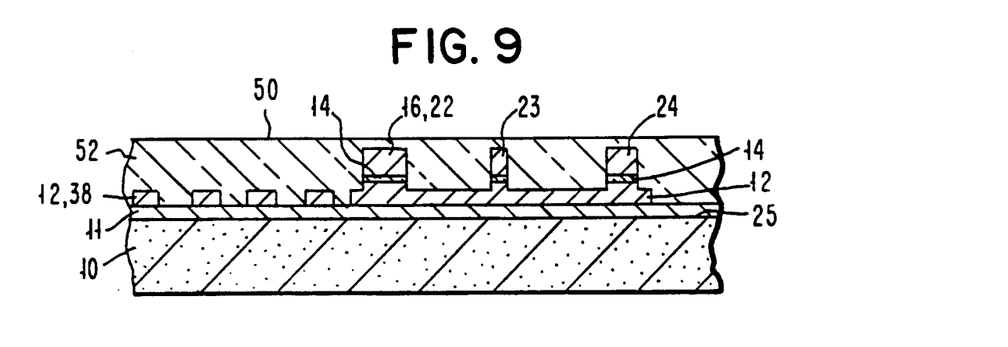

Referring to FIG. 9, upper surface 45 has been polished to form a planar surface 50. The polishing may be formed by chemical-mechanically polishing (CMP) for planarization. The inventors have learned that this process leaves the buried layer 14 about 20 angstroms thick, in excellent condition as evidenced by the tunnel barrier's low leakage current levels in the junctions, uniform current levels in arrays of junctions, and extremely low 1/f noise in superconducting quantum interference devices (SQUID's) where f represents frequency. The chemical-mechanical polishing process has been demonstrated over 5 inch wafers and is scalable to larger wafer sizes.

Figure 10:
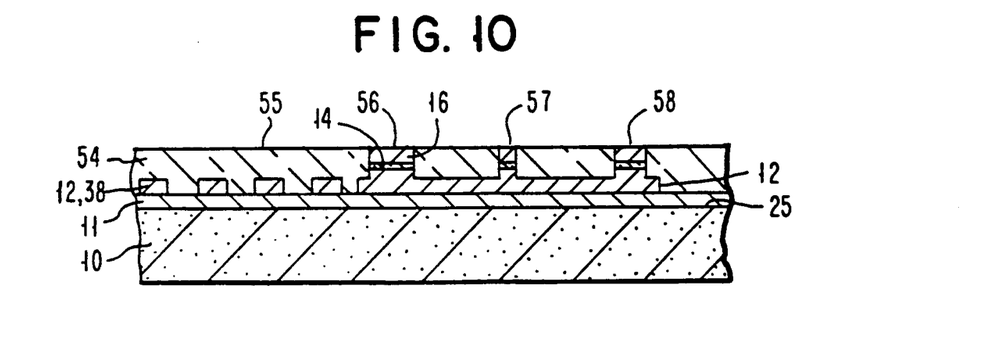

In FIG. 9, fourth layer 52 was chemically-mechanically polished to a planarized upper surface 50. Fourth layer 52 is continued to be processed by chemical-mechanical polishing to form fourth layer 54 having an upper surface 55 which is coplanar with trilayer areas 56-58 which were formerly trilayer areas 22-24. As fourth layer 52 is polished, third layer 16 is exposed and the upper surface of layer 16 of exposed areas are also polished concurrently. Polishing continues of layer 52 until all trilayer areas 22-24 have layer 16 exposed and polished to form coplanar upper surface 56 which is the upper surface of fourth layer 54 dielectric material and the upper surface of trilayer areas 56-58. The inventors have observed that the structures that are left after polishing and preferably chemical-mechanical polishing, leave an upper surface 56 which is completely coplanar and contiguous with trilayer areas 56-58 with no crevices and cracks at the edges of trilayer areas 56-58. Inasmuch as third layer 16 is initially 1500 angstroms thick, the chemical-mechanical polishing is very close to the tunnel barriers, layer 14 of trilayer areas 56-58. Polishing layer 44 shown in FIG. 8 continually to form layer 52 and finally 54 shown in FIG. 10, removes, compensates or cancels the effect of variations in thickness of trilayer areas 22-24, conductors 38-41, substrate and oxide layer 10 and 11 respectively and fourth layer 44 of dielectric material.

Figure 11:
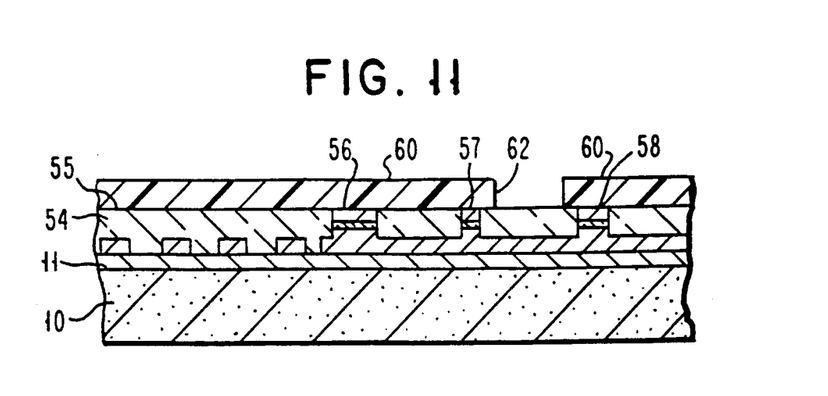
FIGS. 11-13 show process steps for forming resistive elements.
Figure 12:
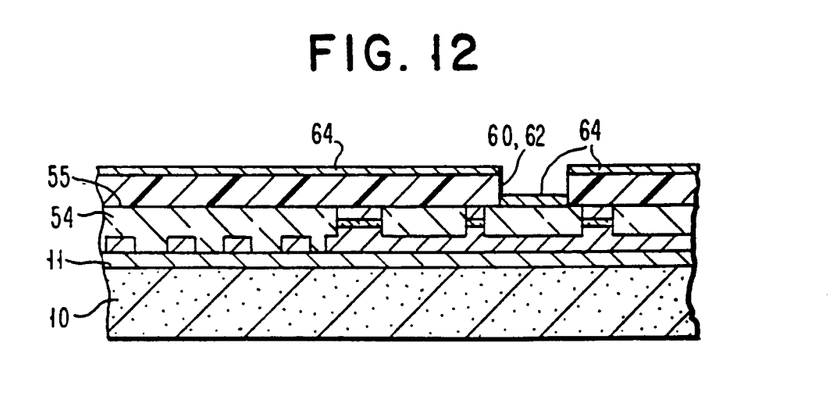
Figure 13:
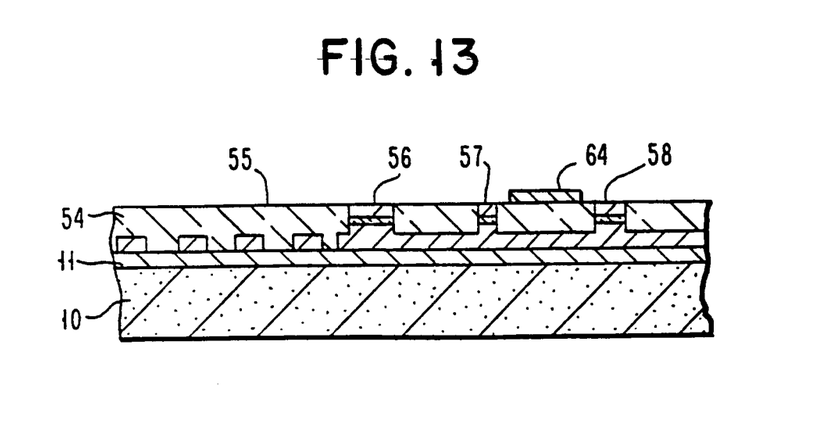
Figure 14:
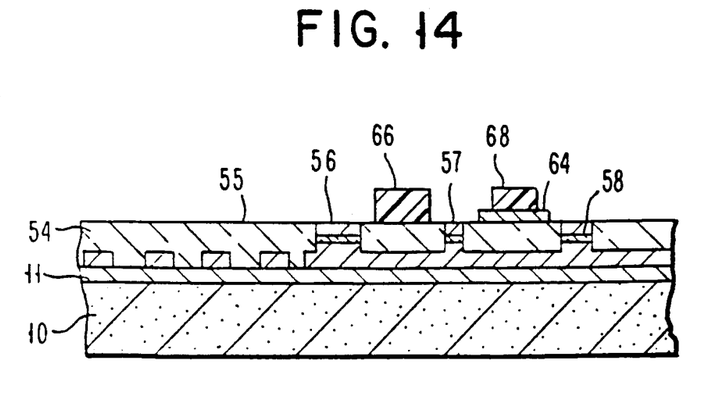
FIGS. 14-16 show process steps for forming self-aligned interconnections on the planarized top surface.
Figure 15:
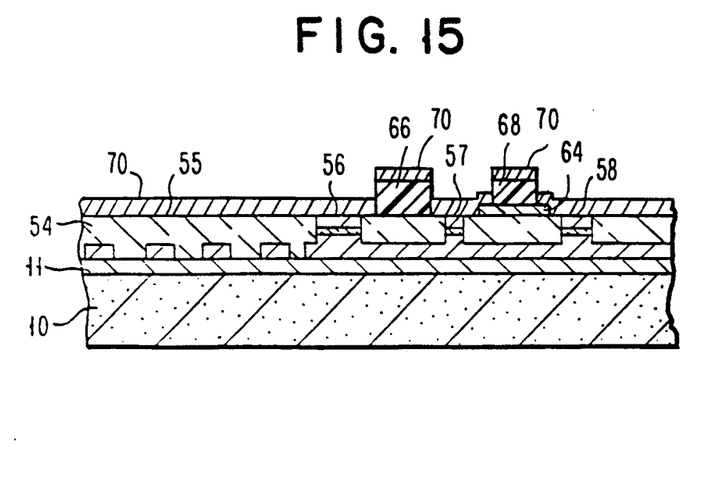
Figure 16:
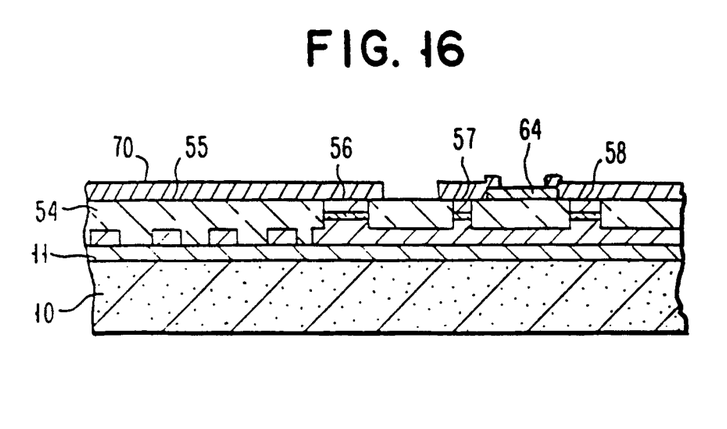

Referring to FIG. 11, a resist 60 may be deposited and patterned to form opening 62. Referring to FIG. 12 a resistor may be formed in opening 62 by depositing resistive material 64. Resistive material over resist 60 may be removed by lifting off or dissolving resist 60 leaving resistive material 64 on upper surface 55 as shown in FIG. 13. Referring to FIG. 14, resist 66 may be deposited and patterned on upper surface 55. Alternatively resist 68 may be deposited and patterned on resistive material 64. Referring to FIG. 15, conductive material 70 is deposited over upper surface 55 and resist 66 and 68, and partially exposed resistive material to form a first layer of interconnections 70 on upper surface 55. Resist 66 and 68 is subsequently dissolved to remove the conductive material 70 deposited thereon to leave the desired metallization pattern 70 on upper surface 55 for interconnecting the Josephson devices, trilayer areas 56-58 and resistive material 64 as shown in FIG. 16.

The resistor and final wiring level as shown by the steps in FIGS. 11-16 are fabricated by deposition and lift-off. It should be noted that the exact sequence of fabrication for the resistor 64 and wiring levels 70 is not critical. These levels can be done in either order to suit the needs of the process and/or facility. Alternatively, it is possible to fabricate one or both of these levels i.e. resistive material 64 and conductive material 70 by deposition and etching. It is noted that the process used should not exceed 200 degrees centigrade.

It should be noted that the planarized process shown in FIGS. 1-16 are tolerant of scaling; use of electron-beam lithography to define these features and should allow scaling to the 0.25 micrometer level and below. In addition, should more wiring levels be desirable or needed, as for example in a Josephson process for digital circuits, a sequence of steps as shown in FIGS. 8-16 may be used. FIGS. 8-16 show dielectric material deposition, polishing to achieve planarization, and metal deposition and lift-off which could be repeated over and over to provide many layers.

In FIGS. 1-16 like reference are used for functions corresponding to the apparatus shown in the preceding or earlier figure.

Process steps shown in FIGS. 11-13 for forming resistors may be changed in the sequence and inserted after FIG. 16. Resistive material 64 may be titanium, an alloy of palladium and gold or molybdenum. An alloy of palladium-gold has an advantage in that it remains resistive down to temperatures less than 1 milli degree Kelvin. Also, an alloy of palladium-gold does not etch in certain gases i.e. CF4 during reactive ion etching (RIE) where titanium does. Thus in place of FIGS. 13-16 deposition of layer 70 may be done followed by RIE to form the desired pattern if resistive material 64 and the gas selected results in non-etching of resistive material 64. Layer 70 may be niobium, lead, or high-Tc material which may be patterned by ion milling.

Additional wiring levels may be added to the structure shown in FIG. 16 by depositing a dielectric material for example by sputtering quartz to form a layer of amorphous silicon dioxide. Contact openings may be etched in the dielectric layer to expose lower wiring level conductive material 70 which may be niobium. The etch process selected should etch the dielectric material 70 without etching niobium. Niobium may be deposited to fill the hole in the dielectric material and extend the electrical contact to the next wiring level. The niobium may the be polished to form a stud structure extending from the lower wiring level and coplanar with the upper surface of the dielectric material. Niobium or some other conductive material may then be deposited to form another wiring layer. Alternatively, after the contact openings are made conductive material may be deposited and patterned to form the subsequent wiring level.

In order to get a good coating more or less conformal with the underlying comma quartz is sputter deposited to a thickness twice the thickness of the trilayer as shown in FIG. 8. For the trilayer, the thickness is typically 3,200-3,500 Angstroms and the silicon dioxide thickness is typically 6,500-7,000 Angstroms.

In order to reduce the temperature of the trilayer areas i.e. the Josephson junctions during RIE, RIE processing is performed intermittently to keep the temperature below 100 degrees centigrade. RIE depth can be controlled by observing the optical emmission with an optical spectrometer which by the emission at certain frequencies will indicate when certain layers of material have been passed through by the change in emission.

Conductive material 70 may also be niobium nitride which may be deposited by sputtering lead which may be deposited by evaporation or high-$T_c$ material which may be deposited by sputtering or laser ablation. Patterning of conductive layer 70 may be accomplished by liftoff, RIE, or ion milling, well known in the art. Dielectric material 44 may be quartz, silicon nitride, aluminum oxide, silicon boron nitride, boron nitride, anodized aluminum, anodized niobium, polyimides, tetrafluoroethylene, polystyrene, and other polymeric material having stable mechanical properties at the temperatures needed during processing. The above materials may either be deposited by chemical vapor deposition (CVD) or sputtering.

Figure 17:
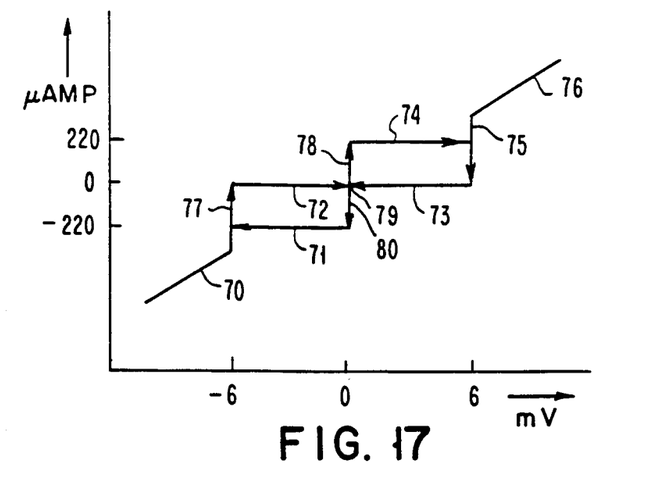
FIG. 17 is a graph of the current-voltage characteristics of 2 Josephson junction devices connected in series.

Referring to FIG. 17, a graph of the current-voltage characteristics of two Josephson junction devices connected in series is shown. The Josephson junction devices were square, 5 by 5 micrometers, and had an area of 25 square micrometers. In FIG. 17, the abscissa represents voltage in millivolts and the ordinate represents current in microamperes. The Josephson junction devices were trilayers of Nb-AlOx-Nb produced by the process steps shown in FIGS. 1-16. In FIG. 17, curves 70-78 and 80 were traced out by an oscilloscope with the devices at 4.2 degrees Kelvin obtained by immersing the devices in liquid helium. Curves 71-74 were very faint or did not show up at all on the scope. The junctions have excellent characteristics as evidenced by Vm's greater than or equal to 80 mV. Vm is defined as the product of the critical current of the Josephson device multiplied by the resistance of the device at 2 mV. In FIG. 17, the critical current is about 220 microamperes shown by curve 78 to point 79 or by curve 80 to point 79.

Figure 18:
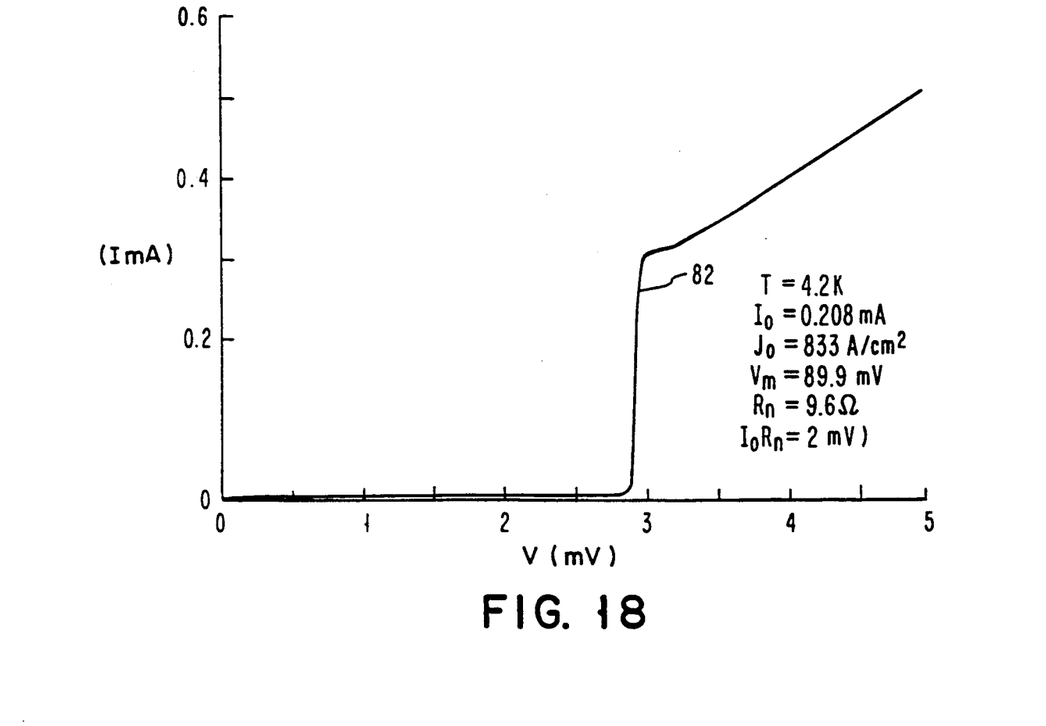
FIG. 18 is a graph of the average current-voltage characeristics of one Josephson junction device from data taken of two devices connected in series.

Referring to FIG. 18, a graph of the average current-voltage characteristic of one Josephson junction device from data of two devices connected in series is shown. In FIG. 18 each device connected had an area of 25 square micro-meters, 5×5 micrometers square. A magnetic field was applied to the devices large enough in the plane of the junction to suppress the Josephson critical current. The critical current, I subscript zero, was 0.208 mA. The temperature was 4.2 Kelvin. The critical current density, J subscript zero, was 833 A/cm squared. Vm was calculated to be 89.9 mV. The resistance at two mV, R subscript n, was calculated to be 9.6 ohms (I subscript zero multiplied by R subscript n equals 2 mV). Curve 82 shows the average current-voltage characteristic of one Josephson junction device.

Figure 19:
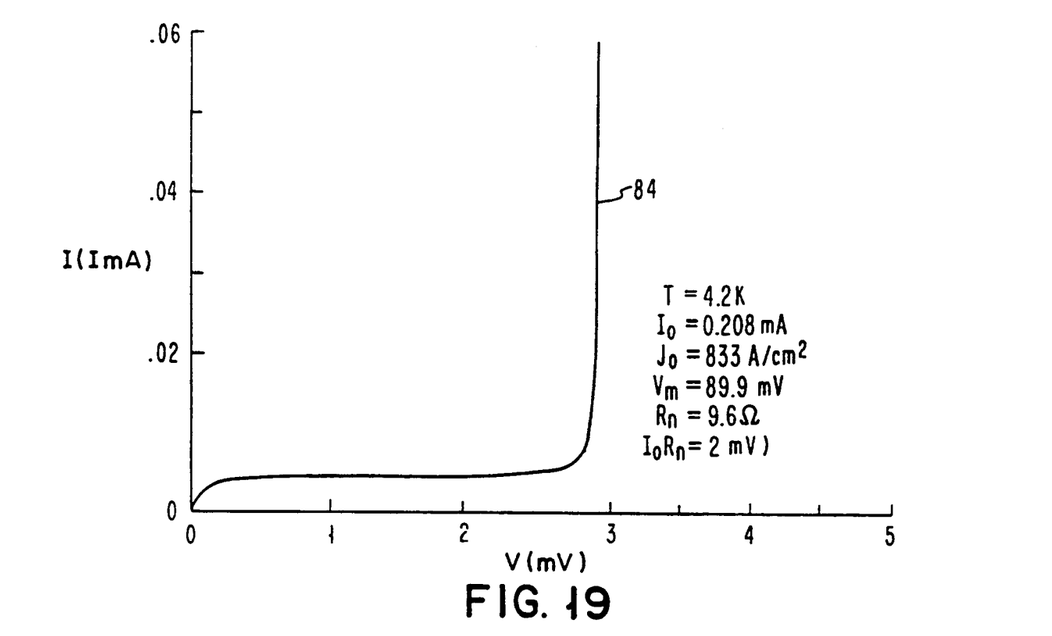
FIG. 19 is a portion of FIG. 18 with the current scale of the graph enlarged by 10.
Figure 20:
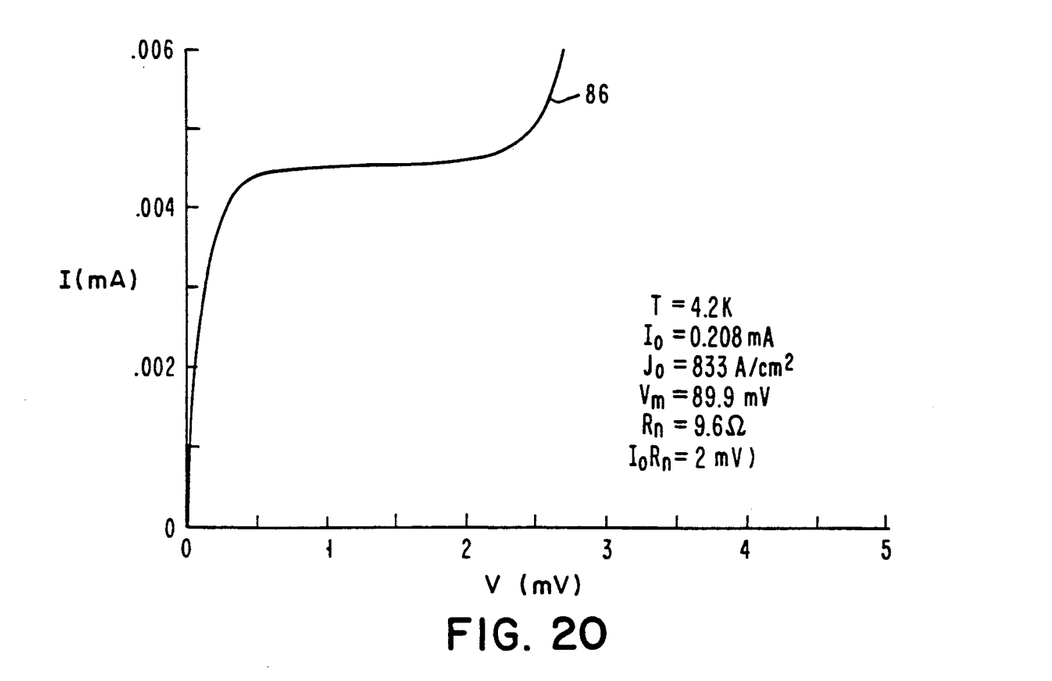
FIG. 20 is a portion of FIG. 18 with the current scale of the graph enlarged by 100.

Referring to FIGS. 19 and 20, a portion of FIG. 18 with the current scale enlarge by 10× and 100×, respectively is shown by curves 84 and 86, respectively.

Figure 21:
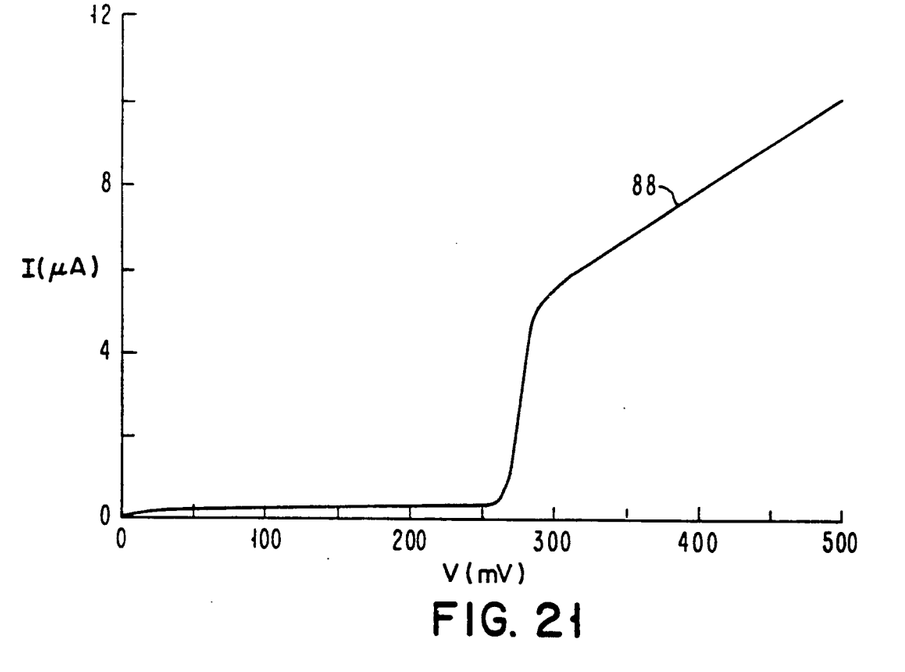
FIG. 21 is a graph of the current-voltage characteristics of one hundred Josephson junction device connected in series.
Figure 22:
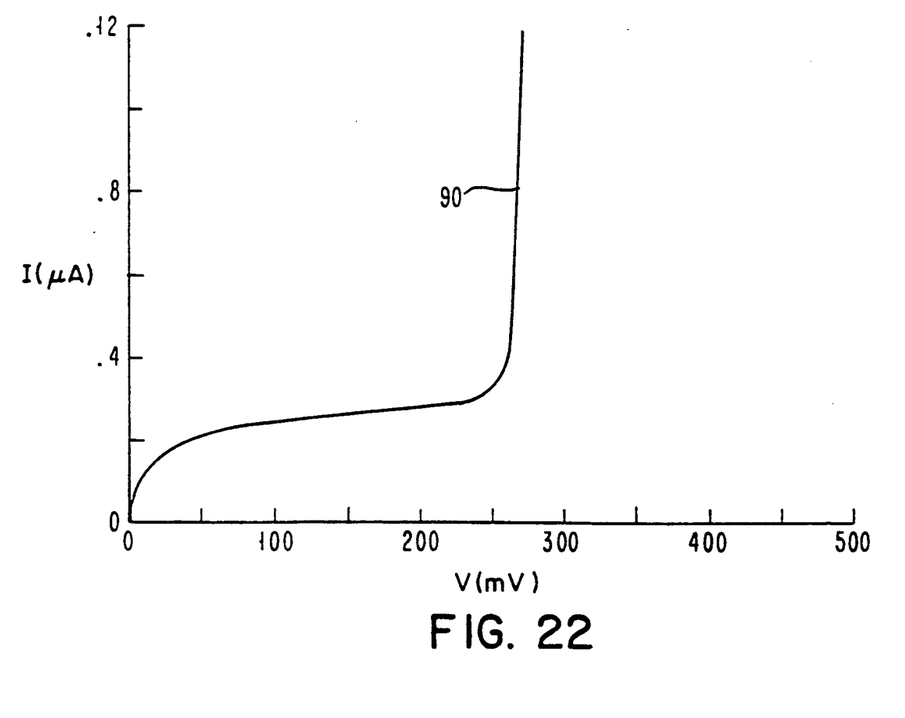
FIG. 22 is a portion of FIG. 21 with the current scale of the graph enlarged by 10.

Referring to FIG. 21, a graph of the current-voltage characteristics of one hundred Josephson junction devices connected in series is shown by curve 88. FIG. 22 is a portion of FIG. 21 with the current scale of the graph enlarged by ten which shows curve 90. In FIGS. 21 and 22, the Josephson junction devices were submicron with an area of about 0.5 square micrometers. The design shape of the junction was square 0.7×0.7 micrometers.

In FIGS. 18-22 the ordinate represents current and the abscissa represents voltage. The devices were immersed in liquid helium at 4.2 degrees Kelvin.

The process step shown in FIGS. 1-16 have been used to produce working superconducting quantum interference devices (SQUID'S), gradiometers, and other Josephson devices. The SQUID'S fabricated by this process have a measured intrinsic energy sensitivity of 20 h and exhibit a white noise transitioning to 1/f noise where f is frequency at a frequency of a few hertz, about ten hertz.

The improvement of Vm's of 80 mV from work reported by others of 20-30 mV and of 60 mV is believed to be due to junction quality which in turn is due to the less stringent conditions employed in the process shown in FIGS. 1-16. For example lower temperatures and possible stress relief during chemical-mechanical polishing to planarize the the fourth layer and polishing the third layer to be coplanar with the fourth layer. The process shown in FIGS. 1-16 is applicable to junction systems such as Nb/NbOx/Pb-alloy and NbN/MgO/NbN, and even high-Tc materials with a suitable barrier material such as $Y_2O_3$ $LaAlO_3$ and PrBaCuO which may be deposited by sputtering or laser ablation.

Having thus described our invention, what we claim as new and desire to secure by Letters Patents is:

1. A method for making a Josephson integrated circuit comprising the steps of:
    first depositing a first layer of superconductor material on the upper surface of a substrate,
    second depositing a second layer of insulating material on said first layer,
    third depositing a third layer of superconductor material on said second layer to form a trilayer Josephson junction,
    fourth etching through said third and second layers into said first layer in selected areas to form spaced apart trilayer areas each having a selected cross-section area parallel to said upper surface and thinned areas of said first layer between said spaced apart trilayer areas,
    fifth etching selectively said thinned areas of said first layer to form a conductor for interconnecting selected first layers of said trilayer areas,
    sixth depositing a fourth layer of insulating material over said trilayer areas, said conductor and said substrate,
    seventh polishing the upper surface of said fourth layer of insulating material to provide a substantially planar surface, and
    eighth over polishing said third and fourth layers to expose all of said third layers of said trilayer areas to provide a substantially coplanar surface of said third layer of said trilayer areas and said fourth layer whereby quality Josephson junctions are produced and interconnections to the counter electrodes can be made on a coplanar surface.

2. The method of claim 1, wherein said step of sixth depositing said fourth layer includes the step of depositing said fourth layer to a thickness greater than the thickness of said trilayer areas.

3. The method of claim 1, wherein said step of fifth etching selectively includes the step of patterning to form a spiral inductor.

4. The method of claim 1, wherein said step of sixth depositing said fourth layer includes the step of forming more or less a conformal coating.

5. The method of claim 1, wherein said step of sixth depositing said fourth layer includes the step of forming substantially a conformal coating.

6. The method of claim 1, wherein said step of sixth depositing said fourth layer includes the step of sputtering to form substantially a conformal coating.

7. The method of claim 1, wherein said step of seventh polishing includes the step of chemical-mechanical polishing.

8. The method of claim 7, wherein said step of chemical-mechanical polishing includes the step of introducing a slurry including water, an abrasive and an etchant.

9. The method of claim 8, wherein said step of introducing a slurry includes the step of introducing water, an abrasive including silicon and an etchant including KOH.

10. The method of claim 1, wherein said step of eighth over polishing includes the step of chemical-mechanical polishing.

11. The method of claim 10, wherein said step of chemical-mechanical polishing includes the step of introducing a slurry including of water, an abrasive and an etchant.

12. The method of claim 11, wherein said step of introducing a slurry includes the step of introducing water, an abrasive including and an etchant including KOH.

13. The method of claim 1, wherein said step of first depositing includes depositing a low-Tc superconductor.

14. The method of claim 1 wherein said second depositing step includes the step of depositing a metal and the step of anodizing said metal.

* * * * *